United States Patent [19]

Haskell

[11] Patent Number: 4,583,237
[45] Date of Patent: Apr. 15, 1986

[54] TECHNIQUE FOR SYNCHRONOUS NEAR-INSTANTANEOUS CODING

[75] Inventor: Barin G. Haskell, Tinton Falls, N.J.

[73] Assignee: AT&T Bell Laboratories, Murray Hill, N.J.

[21] Appl. No.: 607,931

[22] Filed: May 7, 1984

[51] Int. Cl.$^4$ ............................................. H03M 7/38
[52] U.S. Cl. ....................................... 375/27; 370/99; 370/110.1; 332/11 D; 375/25
[58] Field of Search ....................... 375/25, 26, 27, 30, 375/32, 122; 358/13; 370/110.1, 111, 99; 332/9 R, 11 D

[56] References Cited

U.S. PATENT DOCUMENTS

| | | | |
|---|---|---|---|
| 2,592,061 | 4/1952 | Oxford | 375/32 |
| 3,414,818 | 12/1968 | Reidel | 375/32 |
| 3,518,548 | 6/1970 | Greefkes et al. | 375/33 |
| 3,727,135 | 4/1973 | Holzer | 375/32 |
| 3,823,376 | 7/1974 | Greefkes et al. | 375/32 |
| 3,899,754 | 8/1975 | Brolin | 332/11 |
| 3,975,588 | 8/1976 | Besseyre et al. | 179/1 |
| 4,099,122 | 7/1978 | Van Buul | 375/30 |
| 4,352,191 | 9/1982 | Un | 375/30 |
| 4,549,304 | 10/1985 | Weirich et al. | 332/11 D |

OTHER PUBLICATIONS

ICC 71, "An Adaptive Pulse Code Modulator for Speech", by R. M. Wilkinson, pp. 1–11–1–15.
ICC 73, "Adaptive Predictive Speech Coding Based on Pitch-Controlled ... ", by A. H. Frei et al, pp. 46-12-4-6-16.
Electronics Letters, vol. 9(14), Jul. 12, 1973, "'Nearly Instantaneous'. . . ", by M. G. Croll et al, pp. 298–300.
The Radio and Electronic Engineer, vol. 49, Jan.–Dec., 1979, "An Amplitude-Controlled ... ", by C. V. Chakravarthy, pp. 49–54.

Primary Examiner—Robert L. Griffin
Assistant Examiner—Raymond C. Glenny
Attorney, Agent, or Firm—Erwin W. Pfeifle

[57] ABSTRACT

The present invention relates to a near-instantaneous companding coder wherein the peak a-c amplitude of an input signal is measured over a block of K samples. Each of the K samples is coded into an n-bit quantized sample code word based on a step size quantizing control signal determined from the measured peak a-c amplitude. The step size quantizing control signal, and other overhead information such as parity, sync, etc., are formed into a K-bit overhead word and transmitted serially by adding a separate bit of K-bit overhead word to each of the corresponding K n-bit quantized sample code words associated with an immediately prior block of K sample code words. At the remote decoder, the received K-bit overhead information word is stored and used to decode the next subsequent block of K received n-bit quantized sample code words.

6 Claims, 4 Drawing Figures

TECHNIQUE FOR SYNCHRONOUS NEAR-INSTANTANEOUS CODING

TECHNICAL FIELD

The present invention relates to a near-instantaneous companded coder and decoder and, more particularly, to a coder and decoder wherein each generated n-bit quantized amplitude sample code word, of a block of sample code words, is sent to the decoder including an extra bit of overhead information so that in a block of K samples, K-bits of overhead information is sent in serial form.

DESCRIPTION OF THE PRIOR ART

With near-instantaneous companding (also known as "syllabic") coders, the a-c amplitude of a signal is measured over a block of samples in the manner disclosed, for example, in U.S. Pat. Nos. 3,899,754 issued to J. A. Greefkes et al on July 9, 1974 and 3,975,588 issued to S. J. Brolin on Aug. 12, 1975 and the Article "'Nearly Instantaneous' Digital Compandor For Transmitting Six Sound-Programme Signals In A 2.048 Mbit/s Multiplex" by M. G. Croll et al in Electronic Letters, July 12, 1973, Vol. 9, No. 14 at pages 298–300. A digitized word indicating the maximum amplitude of samples over K samples is usually transmitted first followed by the K quantized amplitude code words associated with a block of K samples and possibly followed by an end-of-block overhead information word, comprising parity, synchronization, etc. The digitized word indicating the amplitude over the block of K samples, can be separately transmitted in parallel form as suggested by the Greefkes et al patent or every so often as suggested by the Croll et al article.

In the above-described prior art techniques, buffering is required at the transmitter and receiver, the audio sampling rate cannot be easily locked to the channel baud rate, and the a-c amplitude cannot be given more error protection than the quantized amplitude bits. More particularly, with high-fidelity audio, where the sampling rate is much higher than with speech, the block length used for near-instantaneous companding can be fairly large. This is because the minimum time interval over which a listener can detect a change in quantizing noise is about the same for both speech and high-fidelity audio. This means that the number of samples in such an interval will be higher for high-fidelity audio than speech in proportion to the respective sampling rates. The sending of information such as parity, sync, overhead information word, etc in an end-of-block word creates a problem in that the reconstructed sampling rate at the receiver has to be constant. By sending an end-of-block word, there is a gap at the point of that word in the received messages destined for the end users. Therefore, a phase-locked loop, or other means, is required to spread the message words over the entire block period.

Therefore, the problem in the prior art is to provide a synchronous near-instantaneous companding coding technique which permits communication between a coder and a remote decoder by the transmission of parity, sync, overhead information word, etc. in a manner which overcomes the above-mentioned problems found with end-of-block words.

SUMMARY OF THE INVENTION

The foregoing problem in the prior art has been solved in accordance with the present invention which relates to a near-instantaneous companded coder and decoder wherein the a-c amplitude over a block of samples is measured and a separate binary number is generated representative of such maximum amplitude. The present technique for transmitting the separate binary number and other possible overhead information to the decoder permits the reconstructed sampling rate at the decoder to be constant.

It is an aspect of the present invention to provide a near-instantaneous companded coder and decoder wherein the a-c amplitude over a block of samples is measured and a separate binary number is generated representative of such maximum amplitude. An n-bit quantized amplitude sample word is also generated for each sample of the block of samples. In accordance with the present invention, the separate binary number indicative of the maximum amplitude of a block of samples, plus any other overhead information, is transmitted to the decoder using sequential n+1 bit words. Each of the n+1 bit words of a block of words comprises a separate n-bit quantized amplitude sample word plus an extra bit of the overhead information. In this manner in a block of K samples, K-bits of overhead information is sent in serial form.

Other and further aspects of the present invention will become apparent during the course of the following description and by reference to the accompanying drawings.

BRIEF DESCRIPTION OF THE DRAWINGS

Referring now to the drawings in which like numerals represent like parts in the several views.

DETAILED DESCRIPTION

Normally with instantaneous companding, the most significant bits indicate the exponential part of a signal value, e.g., $\sim \log s$. However, even for large amplitude a-c signals some of the samples are small and are, therefore, quantized more finely than necessary. With near-instantaneous companding, the maximum a-c amplitude is measured over a block of samples and transmitted first as a separate number. From this number, the quantizer step size is determined at the transmitter and the receiver. The quantized amplitude values of the samples in a block of sample is then transmitted, after the number determining the step size, possibly followed by an end-of-block overhead information word including parity, sync, etc.

In accordance with the present invention, the a-c amplitude values and the maximum a-c amplitude number and overhead information are transmitted by near-instantaneous companded (syllabic) coders using a method which avoids a separate word for the maximum a-c amplitude number and the overhead information. For purposes of illustration, it will be assumed that n-bits are devoted to each sample's quantized amplitude value. According to the present invention, a code word length of n+1 bits is transmitted at a rate equal to the audio sampling rate. The extra bit in each code word is used to send the digital word for the maximum a-c amplitude over a block and other overhead information such as parity, synchronization, etc. in serial rather than in parallel form. It will be further assumed hereinafter that the "block length" is K samples long. This then provides K bits/block for the overhead information mentioned hereinbefore. The highest quality implementation would require a shift register, or other delay means, for 2K samples as is shown in FIG. 1.

Figure 1:
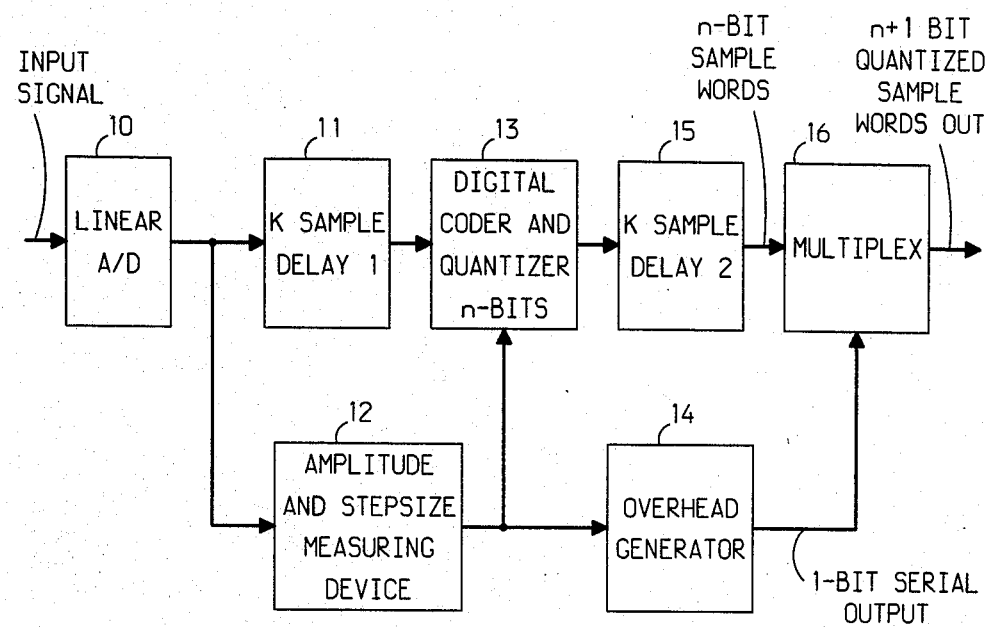
FIG. 1 is a block diagram of a transmitter including a coder and modulator for generating the n+1 bit quantized sample words and overhead information output signals of the present invention.

FIG. 1 is a block diagram of an arrangement for transmitting the K quantized amplitude values plus the overhead information as described hereinbefore. In FIG. 1, the incoming audio signal is provided as an input to a high quality linear analog-to-digital (A/D) converter 10 where the signal is digitized to, for example, 16 bits. The samples are then passed to a first K-sample delay means 11 which provides a delay between the input and output thereof of one block of K sample words. At the same time, the a-c amplitude (peak absolute value) of the output signal from A/D converter 10 is measured over a current block of K samples in Measuring Device 12. After a block of K samples have been produced by converter 10, the a-c amplitude determined in device 12 is used to compute the appropriate step size for use in quantizing the block of K samples being delayed in delay means 11. The step size to be used for the just measured block of K samples is generated as a digital word of predetermined length and is transmitted in parallel form at the output of device 12.

The digital word for the step size determined in measuring device 12 is then delivered to an n-bit digital in/digital out coder and quantizer 13 for coding and quantizing the block of K samples being delivered serially from delay means 11. The digital word for the determined step size is also transmitted to an overhead generator 14 where it is converted from parallel form to a one bit serial form and added to the other overhead information (parity, sync, etc.) to form a K-bit word. The output from overhead generator 14 is one bit of the K-bit overhead information word at the rate of the n-bit samples from coder and quantizer 13.

Figure 3:
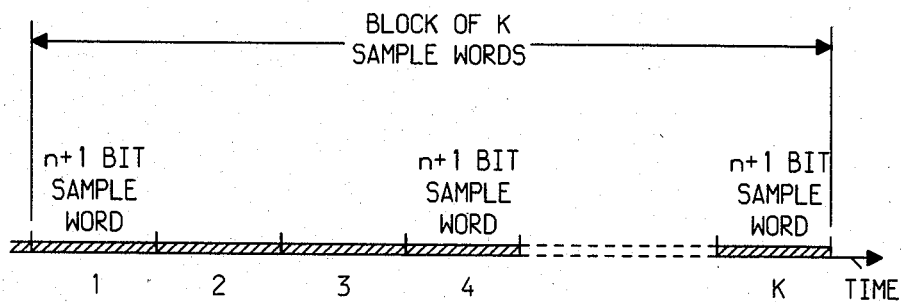
FIG. 3 illustrates the transmission sequence of a block of n+1 sample words at the output of either one of FIGS. 1 or 2.

The output of coder and quantizer 13 is delayed in a second delay means 15 by a period equal to a block of K quantized samples such that when the overhead information word from the current block of K samples is transmitted bit-by-bit from overhead generator 14, delay means 15 is transmitting the K samples in sequence from the immediately previous block of K samples. The outputs from delay means 15 and overhead generator 14 are then applied to a multiplexer 16 to add a separate bit of the latest K-bit overhead word to a corresponding separate word of the immediately prior block of K sample words to produce the n+1 bit quantized sample word at the output of the transmitter. The output from multiplexer 16, therefore, includes a block of K serially transmitted n+1 bit sample words as shown in FIG. 3.

Figure 2:
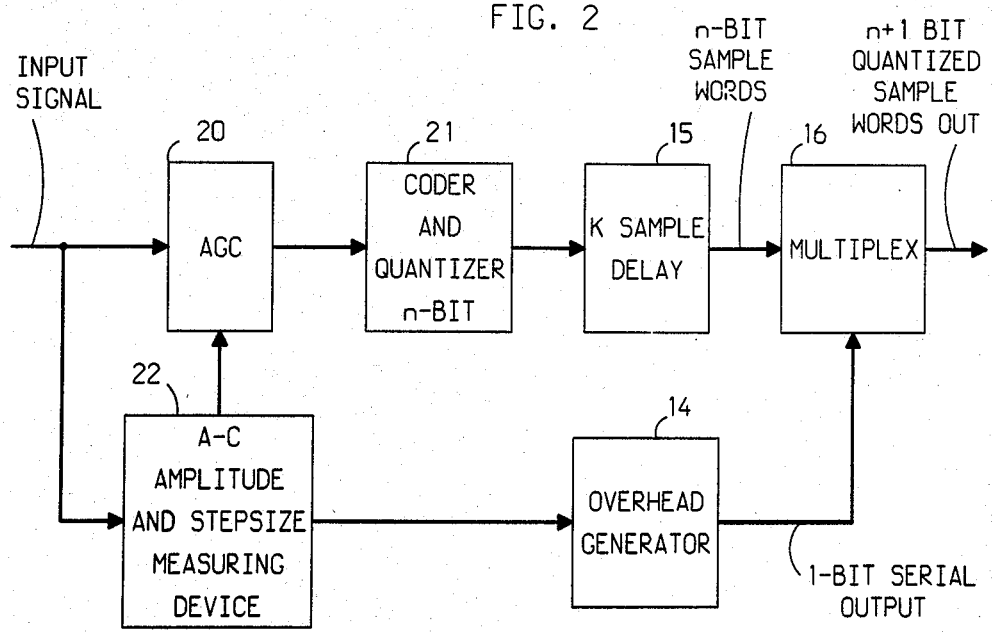
FIG. 2 is a block diagram of an alternate arrangement of the transmitter of FIG. 1 for generating the n+1 bit quantized sample words and overhead information output signals of the present invention.

An alternative implementation of the arrangement of FIG. 1 is shown in FIG. 2. In FIG. 2, the step size used to code a given block of K samples is actually computed based on the maximum a-c amplitude over the immediately previous block of K samples. Thus, the step size might be too large or too small. However, if K is not excessively large, the peak a-c amplitude does not change much from block to block and the error would be negligible. If the absence of a delay means 11 in FIG. 1 is acceptable, then the possibility of further simplification exists using an Automatic Gain Control (AGC) circuit 20 in place of A/D converter 10 of FIG. 1 as shown in FIG. 2.

In FIG. 2, the a-c audio input signal for a sequential block of K samples is applied to an AGC circuit 20 and an a-c amplitude and step size measuring device 22. Measuring Device 22 functions, similar to measuring device 12 of FIG. 1, to determine the amplitude and step size for the current block of K audio input samples of FIG. 2. The digital step size word determined by Measuring Device 22 for a just prior block of K input samples is transmitted to (a) AGC circuit 20 for controlling the maximum gain, or input amplitude range, for the next subsequent block of K audio input samples and to (b) overhead generator 14 for bit-by-bit transmission of the overhead information in the manner explained for overhead generator 14 of FIG. 1.

The output samples from AGC 20 are transmitted to an analog in/digital out coder and quantizer 21 which generates an n-bit word for each sample of the block of K samples based on a fixed quantization (step size) value. In accordance with the arrangement of FIG. 2, the coder and quantizer 21 is the only A/D conversion means that is needed. The output from coder and quantizer 21 is the same as described for coder and quantizer 13 of FIG. 1. If a drift problem is encountered with AGC 20, any suitable means known in the art for overcoming such drift as, for example, a feedback path, can be used to overcome such drift.

The output from coder and quantizer 21 is delayed in a delay means 15 for a time period equal to the length of one block of K quantized samples, and the n-bit quantized samples from the prior block of K quantized samples is serially delivered to a multiplexer 16 concurrent with the serial bits of the K-bit overhead word. The output from multiplexer 16 is the n+1 bit quantized samples and overhead information as shown in FIG. 3.

Figure 4:
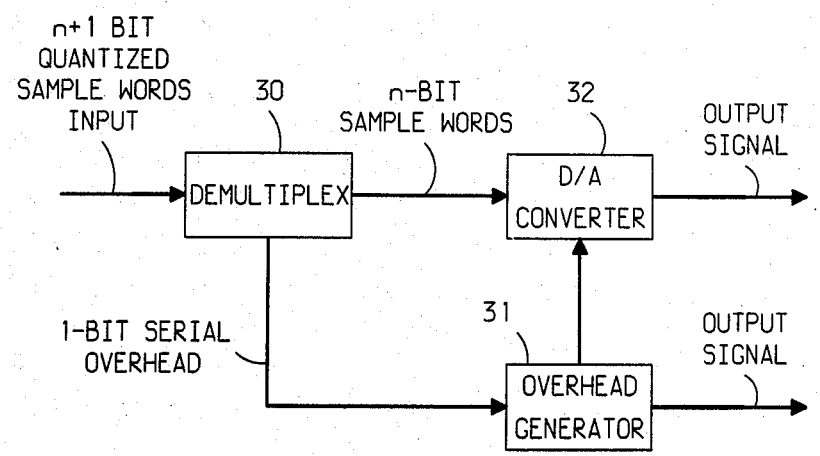
FIG. 4 is a block diagram of a receiver for decoding the n+1 bit quantized sample words and overhead information transmitted by the arrangement of either FIG. 1 or FIG. 2.

At a remote location, the output from multiplexer 16 of either one of FIGS. 1 or 2 is received in a receiver comprising the form shown in FIG. 4. There, the n+1 bit quantized sample words are received in a demultiplexer 30 where the n-bit quantized samples and the one-bit overhead information is separated and transmitted over separate paths. The one-bit overhead information from each of the n+1 bit received words of a block of K words is delivered to an overhead generator 31 which combines the K overhead bits received throughout a block of K words to form (a) the step size control word which is delivered to a D/A converter 32, and (b) the remaining overhead information bits associated with parity, sync, etc. are delivered to appropriate circuitry (not shown) or used by the overhead generator.

In D/A converter 32, the currently received n-bit quantized samples are converted from digital to analog form using the step size control word received in the immediately prior block of n+1 bit quantized sample words. As can be seen from FIGS. 1 or 2, this step size control word, received in the immediately prior block of K quantized sample words, is the step size control word that was used to encode the currently received block of K n-bit quantized sample words and is thus used to appropriately decode the associated block of K n-bit quantized sample words. The output from converter 32 is transmitted to an predetermined user circuit (not shown).

It is to be understood that the above-described embodiments are simply illustrative of the principles of the invention. Various other modifications and changes may be made by those skilled in the art which will embody the principles of the invention and fall within the spirit and scope thereof. For example, when the overhead information is transmitted, it may be protected from transmission noise to a greater degree than the quantized amplitude bits. If K is reasonably large, Forward Error Correcting (FEC) codes might be used on the step size bits. Error detection could automatically zero the audio signal for that block.

What is claimed is:

1. A synchronous near-instantaneous coder comprising:
   means capable of sampling an input analog signal at a predetermined sampling rate;
   means capable of measuring a maximum amplitude variation in a sequence of a plurality of K samples from the sampling means, and generating from the measured maximum amplitude variation a corresponding step size quantizing control signal comprising a digital number representative of such maximum amplitude variation over a block of K samples;
   means capable of quantizing each of the plurality of K samples into a separate n-bit sample code word coded within a predetermined maximum amplitude variation; and
   means capable of transmitting each of the plurality of K quantized n-bit sample code words with an extra bit, each extra bit in the K transmitted n+1 bit quantized sample code words being used to transmit a separate bit of a digital step size quantizing control word, comprising the maiximum amplitude variation number from the measuring means associated with an immediately prior block of a plurality of K samples, and other overhead information in serial form over a block of K of said n+1 bit quantized sample code words.

2. A synchronous near-instantaneous coder according to claim 1 wherein the transmitting means comprises:
   an overhead generator capable of forming the step size quantizing control signal from the measuring and generating means and other overhead information into a predetermined sequence of K bits for transmission at a bit rate which corresponds to the predetermined sampling rate of the n-bit sample code words at the output of the quantizing means;
   delay means for delaying the n-bit sample code words from the quantizing means by a time period which corresponds to that of a block of a plurality of K n-bit sample code words; and
   multiplexing means for multiplexing corresponding ones of the K n-bit sample code words from the delay means and the K bits from the overhead generator for transmitting the n+1 bit quantized sample code words.

3. A synchronous near-instantaneous coder according to claim 2 wherein the quantizing means is responsive to the step size quantizing control signal from the measuring and generating means for quantizing each of the plurality of K samples into the n-bit sample code words within the predetermined maximum amplitude variation as indicated by said step size control signal.

4. A synchronous near-instantaneous coder according to claim 3 wherein the coder further comprises:
   delay means disposed between the sampling means and the quantizing means for delaying the samples by a time period corresponding to the period of a plurality of K samples.

5. A synchronous near-instantaneous coder according to claim 2 wherein the coder further comprises:
   automatic gain control (AGC) means, disposed between the sampling means and the quantizing means and responsive to the step size quantizing control signal from the measuring and generating means associated with an immediately prior block of K samples, for limiting the gain used for a current block of K samples to below a predetermined maximum gain dependent on said step size quantizing control signal.

6. A synchronous near-instantaneous decoder capable of receiving a sequence of a plurality of K n+1 bit quantized sample code words, each quantized sample code word including an n-bit sample code word and a separate bit of a K-bit overhead information word, which K-bit overhead information word includes a step size quantizing control signal comprising a digital number representative of a maximum amplitude variation found over a block of K samples which is associated with the next subsequent block of K n+1 bit quantized sample code words to be received, the decoder comprising:
   demultiplexing means capable of separating the separate bit of the K-bit overhead information word and the n-bit sample word received in each n+1 bit quantized sample code word for propagation along separate paths;
   an overhead generator, responsive to the separate bits of the currently received K-bit overhead information word which are serially received from the demultiplexing means over the sequence of K n+1 bit quantized sample code words, for storing the bits and, after receiving the current K-bit overhead information word, generating therefrom output signals corresponding to (a) the digital number representative of the maximum amplitude variation in the received step size quantizing control signal and (b) other overhead information included in said K-bit overhead information word; and
   means responsive to the step size quantizing control signal from the overhead generator in the K-bit overhead information word received during the prior block of K n+1 bit quantized sample code words for converting each of the n-bit sample code words in the currently received block of K n+1 bit quantized sample code words into an analog equivalent output signal dependent on the value of said step size quantizing control signal.

* * * * *